United States Patent [19]

Moraw

[11] 4,033,690

[45] July 5, 1977

[54] PROCESS FOR THE PRODUCTION OR ERASURE OF DEFORMATION IMAGES AND APPARATUS FOR THE PERFORMANCE OF THE PROCESS

[75] Inventor: Roland Moraw, Naurod, uber Wiesbaden, Germany

[73] Assignee: Hoechst Aktiengesellschaft, Germany

[22] Filed: Mar. 11, 1975

[21] Appl. No.: 557,342

[30] Foreign Application Priority Data

Mar. 16, 1974 Germany .......................... 2412771

[52] U.S. Cl. ................................. 355/9; 346/77 E; 346/151; 340/173 TP; 340/173 LS

[51] Int. Cl.[2] ................. G03G 15/00; G01D 15/02; G11C 11/44

[58] Field of Search .............. 355/9; 346/77 E, 151; 340/173 TP

[56] References Cited

UNITED STATES PATENTS

| | | | |
|---|---|---|---|
| 3,055,006 | 9/1962 | Dreyfoos, Jr. et al. ........ | 346/74 TP |
| 3,871,002 | 3/1975 | Schadlich et al. ............. | 346/74 TP |

*Primary Examiner*—George H. Miller, Jr.
*Attorney, Agent, or Firm*—James E. Bryan

[57] ABSTRACT

This invention relates to an improvement in an apparatus for recording or erasing an electrostatic image by deforming a photoconductive thermoplastic layer of a recording material by heating, including support means for said recording material, charging means for charging the recording material, exposure means for exposing said material, and heating means for developing or erasing said material, the improvement comprising groove means in said support means, above which said recording material is adapted to be continuously conveyed in a self-supporting manner and is adapted to be deformed above said groove means during the recording or erasing.

10 Claims, 4 Drawing Figures

Figure 1:
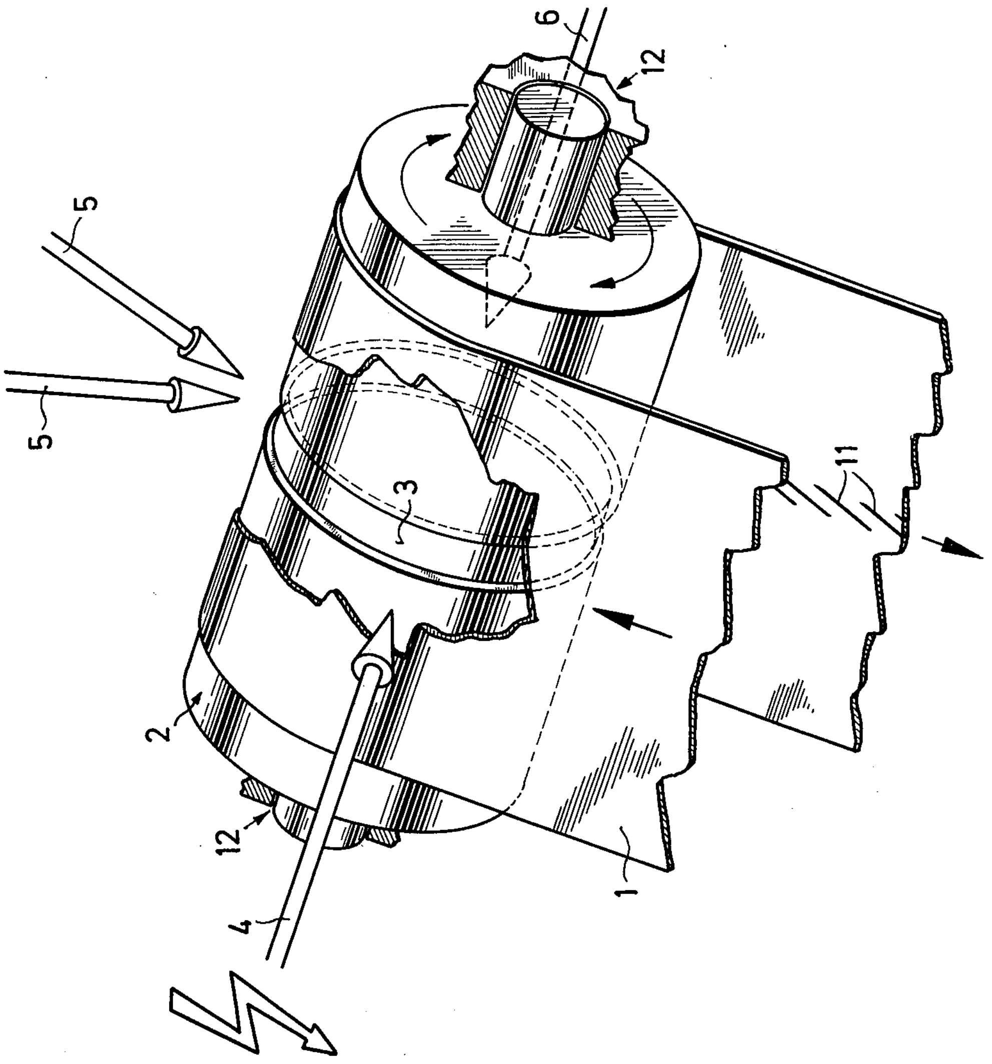

PROCESS FOR THE PRODUCTION OR ERASURE OF DEFORMATION IMAGES AND APPARATUS FOR THE PERFORMANCE OF THE PROCESS

The present invention relates to a process for the production or erasure of deformation images on a recording material comprising a carrier and a thermoplastic, preferably photoconductive, layer applied thereto by electrostatic, optionally imagewise, charging of the layer, exposure to light and/or heating. The invention also relates to apparatus for the performance of the process which comprises a support for the recording material, a charging station, an exposure station, and a heating assembly for the development of erasure of the deformation image.

Thermoplastic, particularly photoconductive thermoplastic layers have the characteristics of a short access time after exposure and erasability of the recorded information. The layers are charged electrostatically, exposed to light, and developed by a thermal shock. The information applied by exposure is stored as a relief image which can be erased by further heating.

Recording has been performed partially relative to the charging, exposure, and development stations in the case of a stationary arrangement of the recording material, partially relative to the recording stations in the case of discontinuous movement of the recording material, only individual images and no image sequences being recorded in the latter case.

The photoconductive, thermoplastic recording materials are particularly suitable for recording phase holograms. One field of application of holography is optical data storage. For this purpose, a process has been suggested (German Offenlegungsschrift No. 2,203,246) in which, on the continuously moving recording material, a sequence of optionally partially overlapping individual holograms can be recorded by means of laser flashes. This recording process is designated as sequential holographic data storage. Sequential holographic data storage with photoconductive, thermoplastic recording materials which are very suitable because of the described short access time of the applied information after exposure is possible only if recording need not be performed in a stationary, discontinuous manner. The object of the present invention therefore is to provide a process for the production or erasure of deformation images on a moving film tape having a thermoplastic, preferably photoconductive layer.

The novel process is based on the initially described process and is distinguished therefrom in that the recording material is continuously moved during treatment and so conveyed that it is self-supporting in the recording zone. In a preferred embodiment, the recording material has only one recording zone.

It is thereby achieved that the recording material can be charged during transport movement without disturbing charge patterns caused by frictional electricity later occurring in the image area, as they occur when charged films are lifted. If required, when the recording material is self-supporting in the recording zone, the electrostatic charge may even be distant from the exposure and development stations. This advantage particularly applies to the use of photoconductive, thermoplastic recording layers on a dielectric carrier film without an electroconductive intermediate layer.

Furthermore, it is achieved that, during transport movement, the recording material can be heated with relatively little heat, e.g. by heat radiation and/or heat convection, up to the development temperature since the heat capacity of the self-supporting recording material is relatively low, which applies, for example, to films with and without a conductive intermediate layer. The heat capacity is increased by orders of magnitude when the film is also supported over its entire area in the recording zone, which leads to undesirable heating of the entire system.

In accordance with the invention, thermal stress in continuous operation is maintained as low as possible. Therefore, the process of the invention also has no impeding heat discharge problems.

The invention also relates to an apparatus for the performance of the process for the production or erasure of deformation images on a recording material, comprising a carrier and a thermoplastic, preferably photoconductive, layer applied thereto, which apparatus comprises a support for the recording material, a charging station, an exposure station, and a heating assembly for the development or erasure of the deformation image. The support has grooves in the recording zone of the recording material. In a preferred embodiment, the support has only one groove. The groove is at least as wide as is the recorded information.

There is thus provided an apparatus which, in a simple construction, solves the problem of continuous production or erasure of deformation images.

Figure 2:
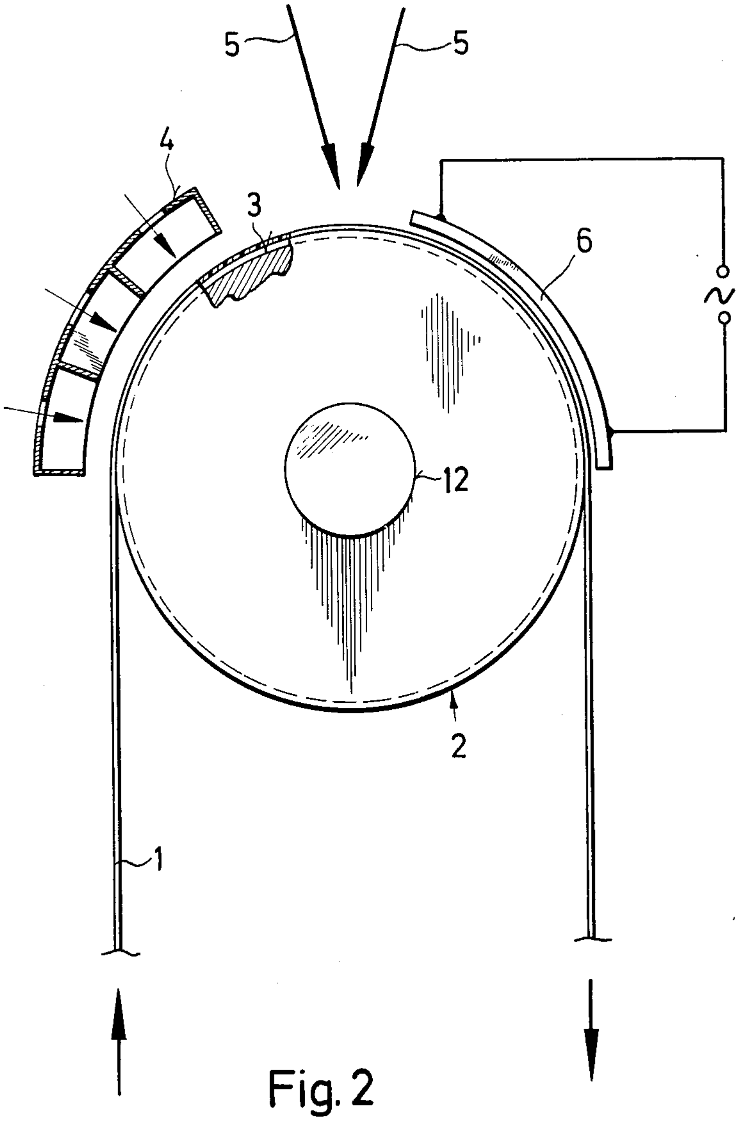
Figure 3:
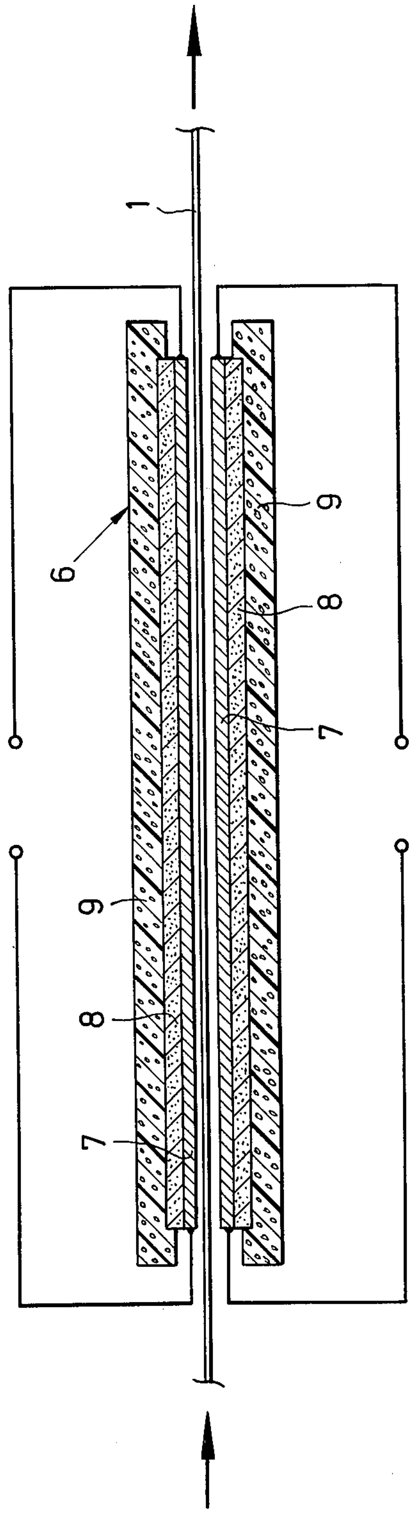
Figure 4:
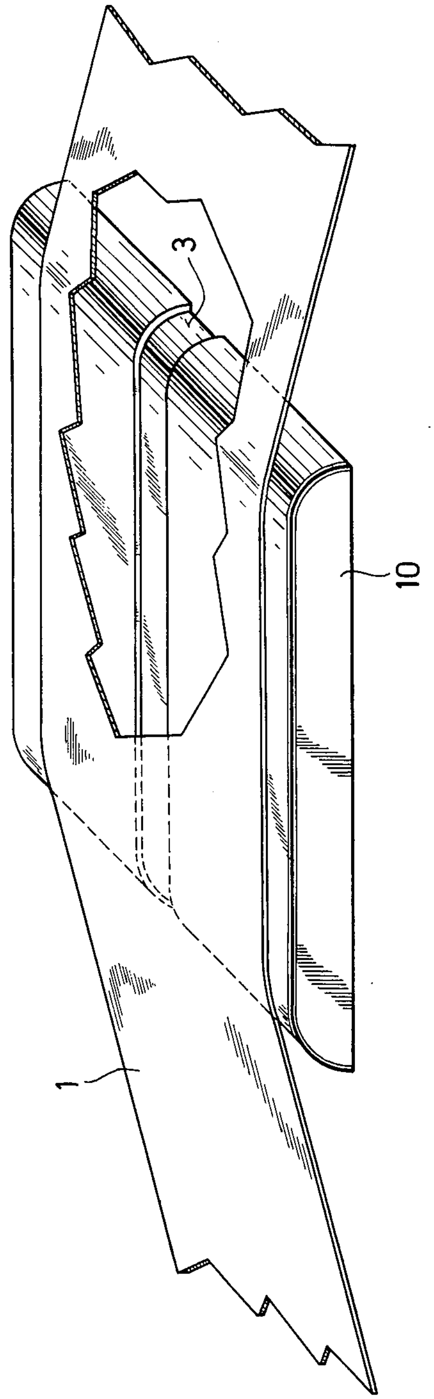

The invention will be further illustrated by reference to the accompanying drawings, in which FIG. 1 is a perspective view of a basic embodiment, FIG. 2 is a schematic showing of the process, FIG. 3 is a suitable heating assembly with a self-supporting recording material, and FIG. 4 shows an embodiment with a guide plate as the support.

Referring to FIG. 1, a film 1 with a photoconductive thermoplastic layer on the inner or outer side is conveyed around a rotating drum 2 as a support. The support has a groove 3 in the drum surface. The groove 3 is so positioned that the film 1 is self-supporting during electrostatic charging — for the sake of simplicity represented only by the arrow 4 —, during exposure to the light beams 5, and during thermal development — also represented only by the arrow 6. For multichannel recording with several tracks, several grooves are correspondingly provided.

Referring to FIG. 2, the drum 2 may be constructed as a pipe of material of good heat conducting properties. If required, it is maintained at the respective temperature, e.g. room temperature, by a blower, for example. The arrangement of the heating elements outside the drum 1 and their control must be performed very carefully. Particularly advantageous is a heating system of heating plates 6 mounted at a distance of about half a millimeter to a few millimeters above the recording material. The heating plates are thin sheets or a network of wires. Well reproducible results are achieved with heating plates having the electroconductive heating layer 7, e.g. of tin oxide, applied to a dimensionally stable ceramic body 8, such as a curved or planar glass plate, as shown in FIGS. 2 and 3. The heating plates 6 may be mounted opposite the drum 2.

The heating plates, however,, also may be at a distance from the drum 2, as can be further seen from FIG. 3. There is shown a gap arrangement of two heating plates 6 through which the recording material 1 is conveyed. By means of such an arrangement, very rapid thermal development is achieved. The compact arrangment may be thermally insulated by the heat insulators 9. With respect to the position of the axis 12 and the surface treatment, a drum 2, as shown in FIGS. 1 and 2, can be machined very accurately with an eccentric error of not more than 0.005 mm.

It is also possible to convey the self-supporting continuously moved recording material 1 over a stationary film guide plate 10, as can be seen from FIG. 4, over which the recording material is so conveyed that it slides. This arrangement is simple and stable. For good film guiding, the recording material is conveyed to the plate 10 and from there at a slight angle, as it is indicated in the Figure. For recording signal sequences of limited total times with an interval in between, the film guide plate 10 may be long and movable on rolls or in guides, in correspondence with the image sequence and the recording speed.

In the recording zone, the groove for self-supporting conveyance of the recording material is so dimensioned that it is at least as wide as the recording width. On the other hand, the carrier of the recording material must not be excessively curved above the groove, also not after electrostatic charging. In the case of symmetrical incidence of the beams 5 for recording holograms, the interference surfaces are perpendicular to the plane of the recording material so that curvatures with vertical displacements up to about 0.1 mm are still tolerable. In the case of greater curvatures, the width of the groove must be smaller or the film carrier must be thicker. With a film carrier of 100 $\mu$m thick material of polyester, for example, widths up to one millimeter are tolerable. This width is sufficient for recording so-called linear, i.e. line, holograms 11.

For discontinuous recording on a recording material, there is sufficient time for the performance of the individual process steps. About 0.1 second, for example, is required for the production of the deformation at an elevated temperature after charging and exposure to light. For recording on a continuously moving recording material according to the present invention, the recording material, despite the movement, must be able to remain for a sufficiently long time in the various process stations. The charging device 4, therefore, advantageously includes several individual corona units, as can be seen from FIG. 2. During exposure to pulse lasers, for example, the continuously moving recording material 1 may be displaced by fractions of a light wavelength only. In the case of pulse lasers of a flash time of $10^{-8}$ sec., web speeds of several hundred centimeters/second are therefore realizable. Also, the length of the thermal development station 6 is so dimensioned that the dwell time of the recording material is about 0.1 second, which corresponds to 10 centimeters at a web speed of 100 cm/sec.

It will be obvious to those skilled in the art that many modifications may be made within the scope of the present invention without departing from the spirit thereof, and the invention includes all such modifications.

What is claimed is:

1. In an apparatus for recording or erasing an electrostatic image by deforming a photoconductive thermoplastic layer of a recording material by heating, including support means for said recording material, charging means for charging the recording material, exposure means for exposing said material, and heating means for developing or erasing said material, the improvement comprising groove means in said support means, above which said recording material is adapted to be continuously conveyed in a self-supporting manner and is adapted to be deformed above said groove means during the recording or erasing.

2. Apparatus as claimed in claim 1 including a plurality of groove means in the surface of said support means.

3. Apparatus as claimed in claim 1 wherein said heating means includes two heating plates having a gap between them through which said recording material is adapted to be conveyed.

4. Apparatus as claimed in claim 1 wherein said support means is a stationary guide plate having groove means therein over which the recording material is adapted to be conveyed, said recording material being guided to and from said plate at a slight angle to the horizontal.

5. Apparatus as claimed in claim 4 wherein said guide plate means is movable on rolls or in guides in correspondence with the image sequence and the recording speed.

6. Apparatus as claimed in claim 1 wherein said support means is a rotatable drum around which the recording material is adapted to be conveyed and said groove means is in the surface of said drum.

7. Apparatus as claimed in claim 6 including heating plates mounted at a distance from said drum, each having an electroconductive heating layer connected to a current supply source, and said heating layer being applied to a ceramic body which is thermally insulated by a heat insulator.

8. Apparatus as claimed in claim 2 wherein said heating means are curved plates mounted outside of said drum at a distance of about half a millimeter to a few millimeters above said drum surface.

9. Apparatus as claimed in claim 8 wherein said heating means are thin sheets having an electroconductive heating layer applied to a dimensionally stable ceramic body.

10. Apparatus as claimed in claim 8 wherein said heating means is a network of wires.

* * * * *

UNITED STATES PATENT AND TRADEMARK OFFICE

CERTIFICATE OF CORRECTION

PATENT NO. : 4,033,690

DATED : July 5, 1977

INVENTOR(S) : Roland Moraw

It is certified that error appears in the above-identified patent and that said Letters Patent are hereby corrected as shown below:

Column 4, line 2 of Claim 4, after "plate" the word --- means --- has been omitted.

Column 4, line 1 of Claim 8, the numeral "2" should read --- 6 ---.

Signed and Sealed this

*Twenty-seventh* Day of *September 1977*

[SEAL]

*Attest:*

RUTH C. MASON
*Attesting Officer*

LUTRELLE F. PARKER
*Acting Commissioner of Patents and Trademarks*